United States Patent
Wieczorek et al.

(10) Patent No.: US 6,812,074 B2
(45) Date of Patent: Nov. 2, 2004

(54) SOI FIELD EFFECT TRANSISTOR ELEMENT HAVING A RECOMBINATION REGION AND METHOD OF FORMING SAME

(75) Inventors: Karsten Wieczorek, Dresden (DE); Manfred Horstmann, Dresden (DE); Christian Krueger, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/391,255

(22) Filed: Mar. 18, 2003

(65) Prior Publication Data

US 2004/0000691 A1 Jan. 1, 2004

(30) Foreign Application Priority Data

Jun. 28, 2002 (DE) .......................................... 102 29 003

(51) Int. Cl.[7] ............................................ H01L 21/339
(52) U.S. Cl. ........................ 438/151; 438/455; 438/933; 438/938
(58) Field of Search ................................ 438/149, 151, 438/455, 458, 933, 938

(56) References Cited

U.S. PATENT DOCUMENTS

| 6,153,920 A | 11/2000 | Gossmann et al. | ......... 257/607 |
|---|---|---|---|
| 6,395,587 B1 | 5/2002 | Crowder et al. | ............ 438/149 |
| 6,593,625 B2 * | 7/2003 | Christiansen et al. | ........ 257/347 |
| 6,689,671 B1 * | 2/2004 | Yu et al. | ...................... 438/486 |
| 2002/0058361 A1 | 5/2002 | Nakaoka et al. | ............ 438/149 |

FOREIGN PATENT DOCUMENTS

| EP | 0 587 520 A1 | 3/1994 | ......... H01L/29/784 |
|---|---|---|---|
| JP | 07050417 | 2/1995 | ......... H01L/29/786 |
| JP | 09321307 | 12/1997 | ......... H01L/29/786 |

* cited by examiner

*Primary Examiner*—Sara Crane
(74) *Attorney, Agent, or Firm*—Williams, Morgan & Amerson, P.C.

(57) ABSTRACT

An SOI transistor element and a method of fabricating the same is disclosed, wherein a high concentration of stationary point defects is created by including a region within the active transistor area that has a slight lattice mismatch. In one particular embodiment, a silicon germanium layer is provided in the active area having a high concentration of point defects due to relaxing the strain of the silicon germanium layer upon heat treating the transistor element. Due to the point defects, the recombination rate is significantly increased, thereby reducing the number of charged carriers stored in the active area.

8 Claims, 2 Drawing Sheets

SOI FIELD EFFECT TRANSISTOR ELEMENT HAVING A RECOMBINATION REGION AND METHOD OF FORMING SAME

BACKGROUND OF THE INVENTION

1. Field of the Present Invention

The present invention relates to the field of manufacture of integrated circuits, and, more particularly, to field effect transistors formed on an insulating substrate, such as silicon-on-insulator (SOI) devices, and to a method of manufacturing such devices.

2. Description of the Related Art

In modern integrated circuits, the number and, hence, the density of individual circuit elements, such as field effect transistors, is steadily increasing and, as a consequence, performance of these integrated circuits is currently improving. The increase in package density and signal performance of integrated circuits requires the reduction of critical feature sizes, such as the gate length and, thus, the channel length, of field effect transistors, to minimize the chip area occupied by a single circuit element and to reduce signal propagation delay owing to a delayed channel formation. However, currently critical feature sizes are approaching 0.1 µm and less and a further improvement in circuit performance by reducing the sizes of the transistor elements is partially offset by parasitic capacitances of the transistors formed in bulk silicon substrates.

In order to meet the ever-increasing demands with respect to device and circuit performance, circuit designers have proposed new device architectures. One technique to improve performance of a circuit, for example of a CMOS device, is to manufacture the circuit on a so-called silicon-on-insulator (SOI) substrate, wherein an insulating layer is formed on a bulk substrate, for example, a silicon substrate or glass substrate, wherein frequently the insulating layer comprises silicon dioxide (also referred to as buried oxide layer). Subsequently, a silicon layer is formed on the insulating layer in which an active region for a field effect transistor device is defined by shallow trench isolation. A correspondingly fabricated transistor is entirely electrically isolated from the regions surrounding the transistor area. Contrary to a conventional device formed on a bulk semiconductor substrate, the precise spatial confinement of the active region of the SOI device significantly suppresses parasitic effects known from conventional devices, such as latch-up and leakage currents drifting into the substrate. Moreover, SOI devices are characterized by lower parasitic capacitances compared to devices formed on a bulk semiconductor substrate and, hence, exhibit an improved high-frequency performance. Moreover, due to the significantly reduced volume of the active region, radiation-induced charge carrier generation is also remarkably reduced and renders SOI devices extremely suitable for applications in radiation-intensive environments.

On the other hand, the advantages of SOI devices over conventionally fabricated devices may partially be offset by the so-called floating body effect, wherein minority charge carriers, for example, holes in an N-channel MOS transistor, are accumulated below the channel region, thereby adversely affecting the transistor characteristics, such as the threshold voltage, single-transistor-latch-up, and the like.

With reference to FIGS. 1 and 2, depicting a schematic cross-sectional view of a bulk transistor and an SOT transistor, respectively, the problems involved with typical prior art bulk MOS transistors and typical prior art SOI MOS transistors will now be explained in more detail.

In FIG. 1, an N-channel transistor 100 is formed on a silicon substrate 101. The transistor 100 comprises an active region 102 defined by shallow trench isolations 105. The active region 102 comprises a source region 103 and a drain region 104. A gate electrode 106 is formed over the active region 102 and is electrically insulated therefrom by a gate insulation layer 107. Adjacent to the gate electrode 106, sidewall spacers 108 of a dielectric material are formed. Top portions of the drain and source regions 103 and 104 and of the gate electrode 106 comprise silicided areas 109 exhibiting an increased electrical conductivity.

In operation, the drain diode formed by the N-doped drain region 104 and the P-doped active region 102 is usually reverse-biased, wherein the bias voltage may become sufficiently high to initiate a weak avalanche-breakdown. In this operation mode, electron-hole pairs are created, indicated by the minus (−) and plus (+) signs, respectively, in FIG. 1. In the present example of the N-channel enhancement transistor 100, the electrons may drift away with the drain current affected by the voltage applied to the source region 103 and the drain region 104. The holes, on the other hand, drift into the active region 102 and into the substrate 101. Since the active region 102 and the substrate 101 are electrically connected to ground potential via corresponding contacts (not shown), the excess charges, i.e., the holes that have drifted into the active region 102 and the substrate 101, can be drained off to avoid charge carrier accumulation and, hence, maintain the long-term stability of the transistor's threshold voltage and drain-source breakdown voltage.

In FIG. 2, schematically depicting a cross-sectional view of a typical SOI transistor, parts similar or equivalent to those shown in FIG. 1 are indicated with like reference numerals except for a "2" as the leading digit rather than a "1," with the explanation of those parts being omitted. In FIG. 2, the transistor 200 is formed in an active layer 201A which may be comprised of silicon, wherein a buried silicon dioxide layer 210 electrically insulates the active layer 201A and the active region 202 from the bulk substrate 201, contrary to the bulk device 100 in FIG. 1.

In operation, similarly to the transistor 100, electron-hole pairs are also created in the transistor 200, wherein, due to the dielectric isolation of the active region 202 from the substrate 201 by the buried oxide layer 210, the excess holes cannot efficiently drain off and accumulate, for example, below a channel connecting the drain region 204 and the source region 203, which forms upon application of an appropriate voltage to the gate electrode 206. The accumulated excess charge leads to characteristic kinks and increases the turn-off switch time of the device, thereby offsetting some of the advantages of SOI devices.

To overcome this drawback, conventional contacts (not shown) are formed that connect the active layer 201A and the active region 202 to a reference voltage to carry off the holes. These additional contacts, however, require further chip area and a more complex device and circuit layout, thereby significantly offsetting the improvement in chip area reduction and signal processing performance attained by reducing critical dimensions.

For this reason, it has been proposed in "Bandgap engineering technology for suppressing the substrate-floating-effect in 0.15 µm SOI-MOSFETS," *Proceedings*, 1995 *IEEE International SOI Conference*, October 1995, by Yoshimi et al., to compensate for the floating body effect without additional body contacts by means of bandgap engineering to enhance the hole flow in the source direction by forming a silicon germanium layer in the source and drain regions. Germanium ions were implanted into the source and drain regions after gate oxidation in N-channel SOI MOSFETS. A silicon germanium layer was formed within the source and drain regions, resulting in an energy difference of the bandgap of 0.1 eV in the vicinity of the pn junction. An improvement of the drain breakdown voltage of approximately IV was obtained with this arrangement. The provision of a silicon germanium layer within the highly doped source and drain regions, however, may lead to a significantly increased resistance of these regions, thereby compromising the performance of the transistor device. This problem is exacerbated as transistor dimensions are scaled down further, requiring extremely shallow junctions at the source and drain regions.

In view of the above problems, a need exists for improved SOI transistor elements and methods of fabricating the same, whereby the adverse floating body effect may be eliminated or at least reduced without substantially compromising the transistor characteristics.

SUMMARY OF THE INVENTION

Generally, the present invention is based on the inventor's concept to provide a recombination region having an increased density of localized recombination centers within the active region of an SOI device without comprising the crystalline quality of the remaining active region of the device.

According to one illustrative embodiment of the present invention, a field effect transistor is provided wherein the field effect transistor is formed on a substrate having formed therein an insulating layer followed by a semiconductor layer. An active region formed in the semiconductor layer includes a source region and a drain region separated by a channel region on which a gate insulation layer is formed that electrically insulates a gate electrode from the channel region. A recombination region is formed in the active region, wherein a density of recombination centers in the recombination region is higher than a density of recombination centers in the semiconductor layer.

According to a further illustrative embodiment of the present invention, a method of forming a transistor element on an insulated substrate comprises providing a substrate having formed thereon an insulating layer and forming a first and a second monocrystalline semiconductor layer on the insulating layer, wherein the first and the second monocrystalline layers have a different lattice constant to create strain in the first monocrystalline semiconductor layer. Next, a transistor element is formed in and on the first and second semiconductor layers, wherein one or more heat treatments performed during formation of the transistor element reduce the strain in the first semiconductor layer and generate a first density of point defects in the first semiconductor layer that is higher than a second density of point defects in the second semiconductor layer.

BRIEF DESCRIPTION OF THE DRAWINGS

The invention may be understood by reference to the following description taken in conjunction with the accompanying drawings, in which like reference numerals identify like elements, and in which.

Figure 1:
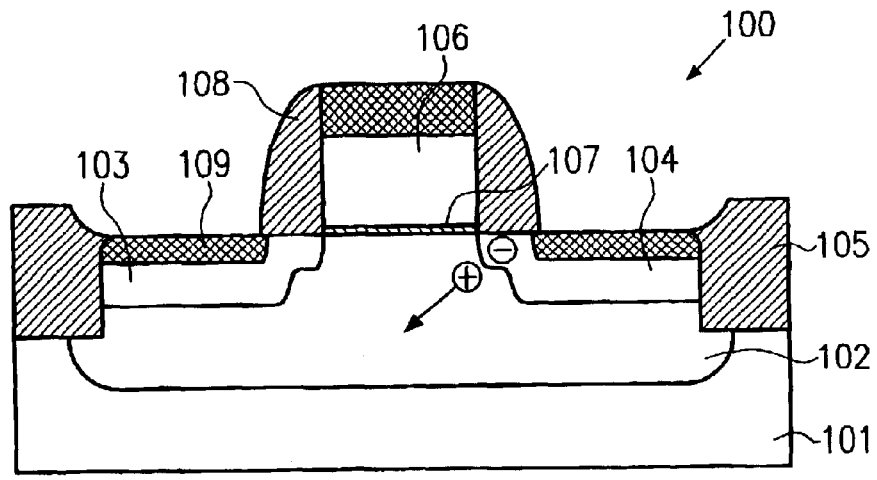
FIG. 1 schematically shows an example of a conventional transistor element formed on a bulk semiconductor substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various structures of the semiconductor device and the implant regions are depicted in the drawings as having very precise, sharp configurations and profiles, those skilled in the art recognize that, in reality, these regions and structures may not be as precise as indicated in the drawings. Additionally, the relative sizes of the various features and implant regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the following detailed description refers to silicon-based transistor elements that are formed on a substrate, including an insulating layer with a semiconductor layer formed thereon, in which the active area of the transistor is to be formed. This type of transistor element will be referred to as SOI transistor element, wherein, however, this term is meant to encompass the general concept of transistor elements formed on an insulating substrate, irrespective of the type of semiconductor material used. For instance, the basic ideas of the present invention may also be applied to germanium-based transistor elements, gallium arsenide based transistor elements, or any other III–V or II–VI semiconductors.

Moreover, the following discussion will refer to n-channel transistor elements in which the problem of charge carrier accumulation is especially pronounced as the holes, i.e., the minority charge carriers, have a significantly lower mobility compared to the electrons and thus may not drain off through the source terminal as efficiently as electrons in a p-channel element. However, the present invention should not be considered as limited to the illustrative n-channel elements described herein unless such limitations are expressly set forth in the appended claims.

The present invention is based on the inventors' finding that the provision of so-called recombination centers, i.e., lattice sites having a high probability for capturing of charge carriers that are then available for recombining with a corresponding inverse charge carrier, which are localized within a well-defined portion of the active area of a transistor element, may significantly reduce the number of accumulated charge carriers. Moreover, in order to not sacrifice the quality of the active transistor area, the recombination centers should be confined to the well-defined portion as much as possible during elevated temperatures possibly experienced by the semiconductor device during fabrication and operation. This is accomplished by forming a substantially lattice-matched region in the semiconductor active area, wherein the slight lattice mismatch leads to a strain in this layer, which may be relaxed or reduced during subsequent heat treatments, such as a dopant activation or a gate oxidation process. Reducing the strain in this layer upon heat-treating the device leads then to the generation of a plurality of point defects that are localized or "stationary" and act as recombination centers. Furthermore, the bandgap of the recombination layer may be tailored to promote the effect of the increased recombination probability of the charge carriers by, for example, providing a reduced bandgap energy compared to the remaining active region, which may lead to an increased hole mobility. For example, it has been shown that a silicon germanium layer having a lower bandgap energy results in an increased hole mobility.

Figure 3:
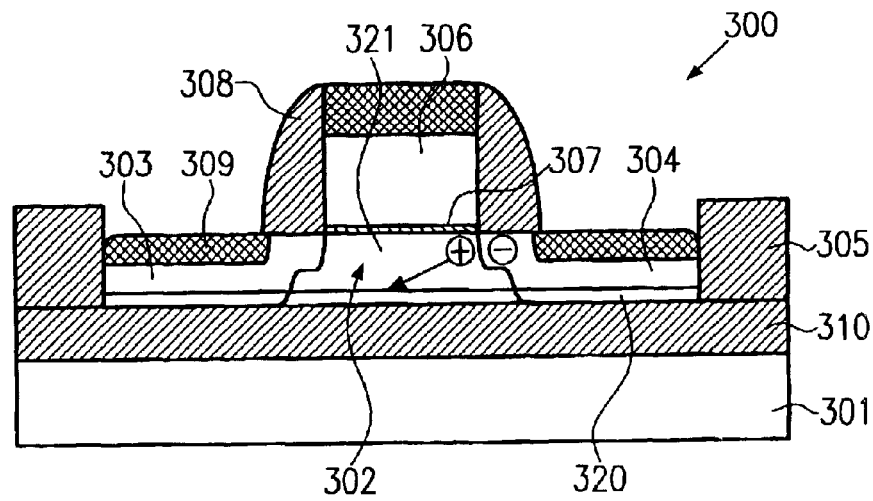
FIG. 3 schematically shows a cross-sectional view of an SOI transistor element according to one illustrative embodiment of the present invention.

With reference to FIG. 3, one illustrative embodiment of the present invention will now be explained. In FIG. 3, a transistor element 300 comprises a substrate 301, for instance a silicon substrate or any other appropriate substrate, with an insulating layer 310 formed thereon. The insulating layer 310 may be a silicon dioxide layer, a silicon nitride layer, or any other appropriate insulating layer. Above the insulating layer 310 is formed an active region 302, including a first monocrystalline semiconductor layer 321 and a second monocrystalline semiconductor layer 320. In one embodiment, the first semiconductor layer 321 is a silicon layer and the second semiconductor layer 320 is a silicon germanium layer having a composition $Si_xGe_{1-x}$, wherein $0.2 > x > 0.8$. Depending on the amount of germanium contained in the second semiconductor layer 320, which is a substantially unstrained layer due to one or more heat treatments carried out during the formation of the transistor element 300, the number of point defects is higher than approximately $10^{12}/cm^3$, and is thus significantly higher than the density of point defects within the first semiconductor layer 321. Depending on the type of transistor element, i.e., fully depleted transistor element or partially depleted transistor element, a thickness of the first semiconductor layer 321 may vary between approximately some tens of nanometers to a few hundred nanometers, wherein a thickness of the second semiconductor layer 320 is in the range of approximately 5–50 nanometers.

The transistor element 300 further comprises source and drain regions 303, 304 adjacent to shallow trench isolations 305. A gate insulation layer 307 electrically and physically isolates a gate electrode 306 from the underlying active region 302. Sidewall spacers 308 are provided adjacent to the gate electrode 306 and silicided portions 309 are formed on top of the source and drain regions 303, 304 and the gate electrode 306.

In the embodiment shown in FIG. 3, the heavily doped source and drain regions 303, 304 extend into the second semiconductor layer 320 and provide a high electrical conductivity to the second semiconductor layer 320. For other embodiments with a silicon germanium layer as the second semiconductor layer 320, the mobility of holes may further be increased due to the reduced bandgap energy in the second semiconductor layer 320. This may promote the carrying off of any holes within the second semiconductor layer 320 via the source terminal.

Figure 2:
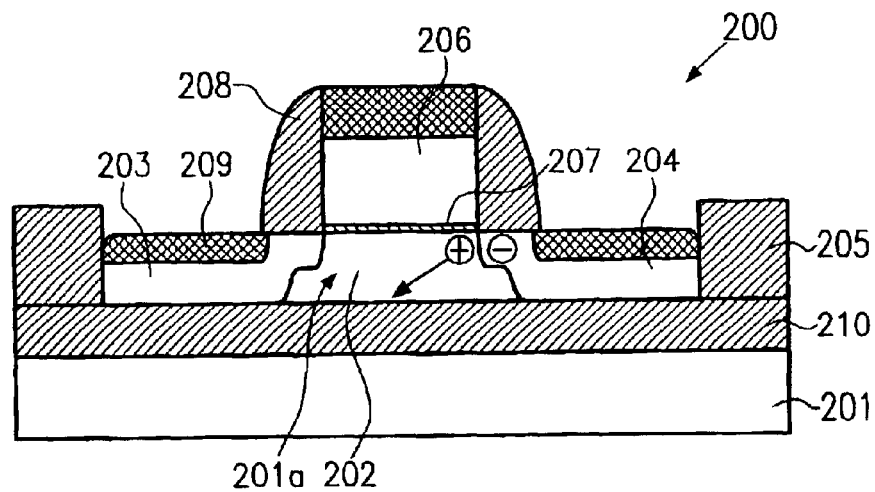
FIG. 2 schematically shows a typical conventional SOI transistor element, wherein for the sake of simplicity body contacts are not shown.

In operation, the reverse-biased drain diode, i.e., the n-doped drain region 304 and the p-doped channel region of the active region 302, may be operated with a voltage leading to increased electron-hole pair generation, wherein the electrons drain off through the drain terminal while the holes, owing to the reduced mobility, may drift within the active region 302. Contrary to the conventional device as, for example, shown in FIG. 2, the increased density of stationary recombination centers within the second semiconductor layer 320 will drastically increase the probability of recombination and, thus, significantly reduce the number of holes that may accumulate within the active region 302, wherein electrons delivered by the source region 303 via an external voltage source "feed" the recombination process. Additionally, the hole mobility is increased and, therefore, the hole current to the source region 303 may increase, thereby removing non-recombined holes. Due to the localized nature of the point defects within the second semiconductor layer 320, the crystalline characteristics of the first semiconductor layer 321 are substantially not affected and, therefore, any device degradation owing to diffusing recombination centers acting as charge carrier scattering sites may be substantially avoided. Thus, the impact of the floating body of the transistor element 300 will be significantly reduced if not completely eliminated.

Figure 4A:
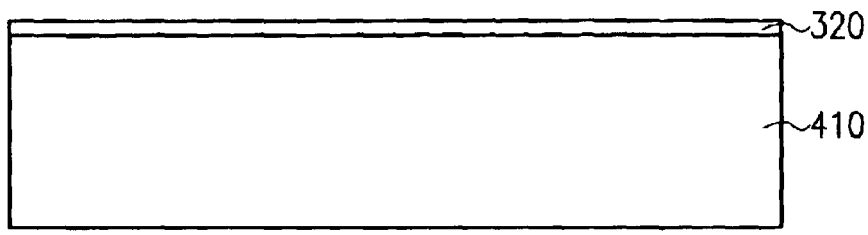
FIGS. 4a–4c schematically show a typical process sequence for forming the transistor element in FIG. 3.
Figure 4B:
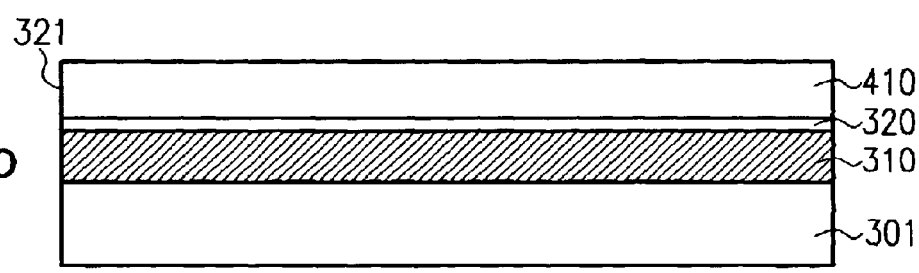
Figure 4C:
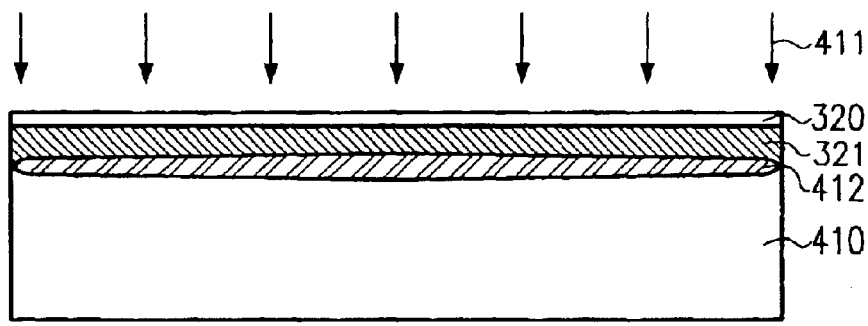

With reference to FIGS. 4a–4c, a typical process flow for forming the semiconductor device as shown in FIG. 3 will now be described. In FIG. 4a, a donor semiconductor substrate 410, such as a silicon substrate, is provided with the second semiconductor layer 320 formed thereon. The second semiconductor layer 320 is epitaxially grown on top of the donor substrate 410, wherein the composition of the second semiconductor layer 320 is selected in accordance with design requirements. Epitaxially growing substantially lattice-matched monocrystalline layers on a monocrystalline substrate is a well-known process in the art and will not be described in detail herein. Owing to the slight lattice mismatch between the second semiconductor layer 320 and the underlying donor substrate 410, a certain amount of strain is created in the second semiconductor layer 320 that depends, among other things, on the composition and the thickness of the second semiconductor layer 320.

As shown in FIG. 4b, additionally to the donor substrate 410, a substrate 301 is provided with the insulating layer 310 formed thereon. In one embodiment, the substrate 301 is a silicon substrate and the insulating layer 310 is a silicon dioxide layer that may be formed by oxidizing the substrate 301 or by depositing a silicon dioxide layer on the substrate 301. Since these processes are well known in the art, a detailed description thereof will be omitted. Subsequently, the substrate 301 and the donor substrate 410 are brought into contact, wherein the second semiconductor layer 320 is on top of the insulating layer 310. The substrate 301 and the donor substrate 410 may be bonded by conventional bonding techniques and thereafter the donor substrate 410 may be thinned by known etch processes to obtain the first semiconductor layer 321.

Next, the transistor element 300 is formed according to a conventional process flow and the description thereof will be omitted. However, in the conventional process flow, a plurality of heat treatments are involved, for example, anneal cycles for activating dopants implanted into the source and drain regions 303, 304 or an oxidation process for forming the gate insulation layer 307. During these heat treatments, the strain in the second semiconductor layer 320 is reduced, thereby generating a plurality of point defects that are confined to the second semiconductor layer 320.

FIG. 4c schematically shows a further method of manufacturing the transistor element 300 by means of the second semiconductor layer 320 on the donor substrate 410, wherein, as previously explained, the second semiconductor layer 320 is epitaxially grown on the donor substrate 410. Thereafter, an ion implantation, as indicated by 411, is carried out using hydrogen ions to generate an implant region 412 at a predefined depth within the donor substrate 410 to substantially define the first semiconductor layer 321. Thereafter, the substrate 301 and the donor substrate 410 are bonded as described in FIG. 4b and subsequently the donor substrate 410 is cleaved, wherein the implant region 412 allows for easy separation of the donor substrate 410. Finally, the remaining surface may be polished to enhance surface quality, wherein the crystalline quality of the first semiconductor layer 321 is substantially unaffected due to eliminating the necessity for any etch procedures that are otherwise used for thinning the donor substrate 410. Thus, the first semiconductor layer 321 exhibits an excellent monocrystalline structure, wherein, additionally, the remaining part of the donor substrate 410 may be used for further processing to serve as another substrate 301 that is to be oxidized or as a further donor substrate 410.

Figure 4D:
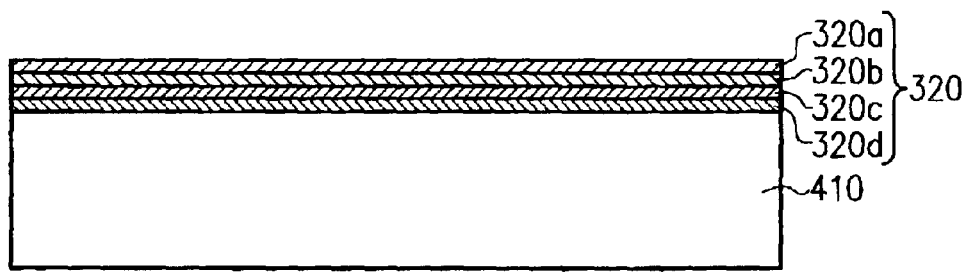
FIG. 4d shows a monocrystalline strain layer, including a plurality of sub-layers according to one illustrative embodiment of the present invention.

FIG. 4d schematically shows a further illustrative embodiment of the present invention. In this example, the second semiconductor layer 320 formed on the donor substrate 410 includes a plurality of sub-layers 320a . . . 320d. The sub-layers 320a . . . 320d may differ from each other by at least one of composition, layer thickness and type of material. For instance, in one embodiment, the sub-layer 320d may comprise a high amount of germanium atoms compared to the adjacent sub-layer 320c so as to induce a high strain and thus a large number of point defects upon heat treating the second semiconductor layer 320 during the further processing. In the remaining sub-layers 320c–320a, the amount of germanium may be gradually reduced to obtain a decreasing density of point defects, whereby, however, a moderate increase of the hole mobility is maintained. Thus, the sub-layers 320d may exhibit a high recombination probability, thereby, however, deteriorating the conductivity within the sub-layer 320d owing to an increased scattering probability, whereas the remaining sub-layers 320a–320c may promote the hole current to the source terminal 303. It should be noted that the above embodiment is of illustrative nature only and a plurality of variations are within the scope of the present invention. For instance, one or more of the sub-layers 320a . . . 320d may be silicon layers that are provided in an alternating fashion with silicon germanium layers.

In one embodiment, the transistor element 300 may be a partially depleted type and it may be advantageous to locate one or more silicon germanium sub-layers in the channel region to provide for a sufficient electron supply in this sub-layer to "feed" the recombination mechanism. Controlling the location of the second semiconductor layer or one of the sub-layers may be accomplished by epitaxially growing a silicon layer (the sub-layers 320a . . . 320c may be considered as a single silicon layer) on a silicon germanium layer (sub-layer 320d), wherein a thickness of the silicon layer 320a . . . 320c in combination with a thickness of the first semiconductor layer 321 (FIG. 4c) determines the location in a depth direction of the sub-layer 320d in the finally obtained active region 302. In other embodiments, the composition of the second semiconductor layer 320 may continuously be varied to obtain a concentration of point defects that varies continuously with depth.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a transistor element on a substrate, the method comprising:

providing a substrate having formed thereon an insulating layer;

forming a first and a second crystalline semiconductor layer, the first and second monocrystalline semiconductor layers having a different lattice constant to create strain in the second semiconductor layer; and forming a transistor element in and on said first and second crystalline semiconductor layers, wherein one or more heat treatments during the formation of said transistor element reduce said strain and generate a density of point defects in said second semiconductor layer that is higher than a density of point defects in the first semiconductor layer.

2. The method of claim 1, wherein forming said first and second semiconductor layers comprises:

epitaxially growing the second semiconductor layer on a crystalline donor substrate; and bonding said substrate and said crystalline donor substrate to each other with the second semiconductor layer located on said insulating layer.

3. The method of claim 2, further comprising thinning said crystalline donor substrate to form said first semiconductor layer.

4. The method of claim 2, further comprising, prior to bonding the substrate and the crystalline donor substrate:

implanting hydrogen ions into the crystalline donor substrate through said second semiconductor layer to form an implant region; and cleaving, after bonding, the crystalline donor substrate at said implant region.

5. The method of claim 2, wherein the second semiconductor layer comprises a silicon germanium layer with a composition $Si_xGe_{1-x}$, wherein x is in the range of approximately 0.2>x>0.8.

6. The method of claim 2, wherein the second semiconductor layer has a thickness in the range of approximately 5–50 nm.

7. The method of claim 5, further comprising epitaxially growing a plurality of sub-layers on the crystalline donor substrate, at least some of the sub-layers differing from each other in at least one of composition, type of material and thickness.

8. The method of claim 5, further comprising varying a composition of the second semiconductor layer while epitaxially growing the same.

* * * * *